United States Patent
Yang

(10) Patent No.: US 7,225,536 B2
(45) Date of Patent: Jun. 5, 2007

(54) PRECASTING MULTI-LAYER PCB PROCESS

(76) Inventor: Ho-Ching Yang, Alley 32, Lane 282, Ping Tung Rd., Ping Chen City, Taoyuan Hsien (TW)

(*) Notice: Subject to any disclaimer, the term of this patent is extended or adjusted under 35 U.S.C. 154(b) by 0 days.

(21) Appl. No.: 11/100,495

(22) Filed: Apr. 7, 2005

(65) Prior Publication Data

US 2006/0225275 A1  Oct. 12, 2006

(51) Int. Cl.
H05K 3/20 (2006.01)
(52) U.S. Cl. .............. 29/831; 29/930; 29/846; 29/848; 174/250; 264/139; 264/272.11; 427/97.1; 427/135
(58) Field of Classification Search .......... 29/825, 29/830, 831, 846–849, 851; 174/250; 264/139, 264/154–156, 272.11; 427/96.1–97.1, 133, 427/135, 348, 350, 372.8, 386, 389.8; 428/411.1
See application file for complete search history.

(56) References Cited

U.S. PATENT DOCUMENTS

| | | | | |
|---|---|---|---|---|
| 4,606,787 A * | 8/1986 | Pelligrino | ................... | 29/848 |
| 5,240,671 A * | 8/1993 | Carey | .......................... | 29/851 |
| 5,333,379 A * | 8/1994 | Odaira et al. | ................ | 29/841 |
| 5,731,086 A * | 3/1998 | Gebhardt et al. | ........ | 428/411.1 |
| 6,797,367 B2 * | 9/2004 | Ogawa et al. | .............. | 174/258 |

* cited by examiner

Primary Examiner—Minh Trinh
Assistant Examiner—Donghai D. Nguyen
(74) Attorney, Agent, or Firm—Leong C. Lei

(57) ABSTRACT

A pre-casting multi-layer PCB process has steel plate mold engraved with circuitry and the epoxy coated on the mold for the epoxy to cover up a fiber glass substrate; conductive material coated on the epoxy to insert molding the former into the latter to form recessed circuitry; then baked and solidified, sandblasted to remove film for the conductive material to become conducted circuitry; the lamination made by layer for achieving even thinner PBC circuitry while maintaining sufficient structural strength.

1 Claim, 8 Drawing Sheets

PRECASTING MULTI-LAYER PCB PROCESS

BACKGROUND OF THE INVENTION (a) Technical Field of the Invention

The present invention is related to a pre-casting multi-layer PCB process, and more particularly, to one that allows even thinner circuitry, higher structural strength, lower production cost, and easier production planning.

(b) Description of the Prior Art

In the manufacturing process for the single layer or multi-layer PCB of the prior art, a negative is needed to be exposed for image transfer of the circuitry on a substrate with a copper foil surface, then etched, drilled, and plated; while in case of multi-layer PCB, additional process of high pressure lamination is required. The manufacturing process of the prior art is found with the following flaws:

1. Complicated, consuming too much efforts and time, thus resulting in higher production cost;
2. In the process of lamination, stress from high pressure usually winds up deformed PCB and variations in dimension; and
3. Enormous consumption of materials and size of process facilities to prevent easier production scheduling.

Furthermore, minimum width of the circuitry must be specified in the PCB manufacturing process of the prior art. Otherwise, the circuitry is vulnerable to shortage or interruption, and insufficient strength.

SUMMARY OF THE INVENTION

The primary purpose of the present invention is to provide a pre-casting process for the manufacturing of multi-layer PCB to correct the flaws found with the prior art and to upgrade the quality of the PCB. To achieve the purpose, a fiberglass substrate is drilled and stuffed with a conductive material. A steel mold engraved with circuitry is coated with epoxy. Both of the mold and the substrate are bound to each other and then the epoxy is fixed to the substrate after the mold is removed. The epoxy is coated with a conductive material for the latter to be consistently distributed on the circuitry of epoxy, air bulb vacuum removed, baked, sandblasted to remove the film, and rinsed before inserting the conductive material in the epoxy circuitry to come up the finished product of the PCB. Finally, upon the lamination of multiple layers, the circuitry on the most outer layer where pending soldering is plated to improve its mechanical strength.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
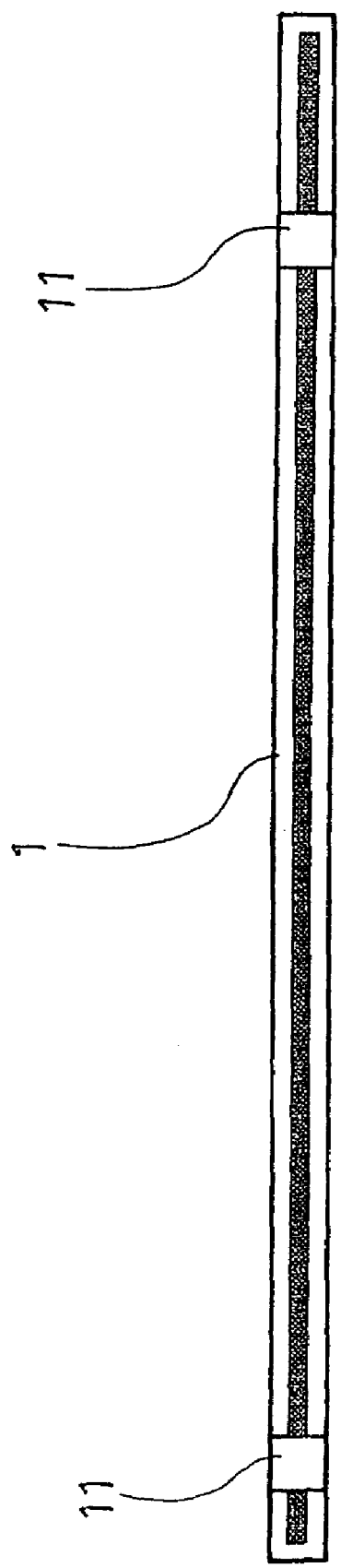
FIG. 1 is a schematic view showing a structure of a substrate of the present invention.
Figure 2:
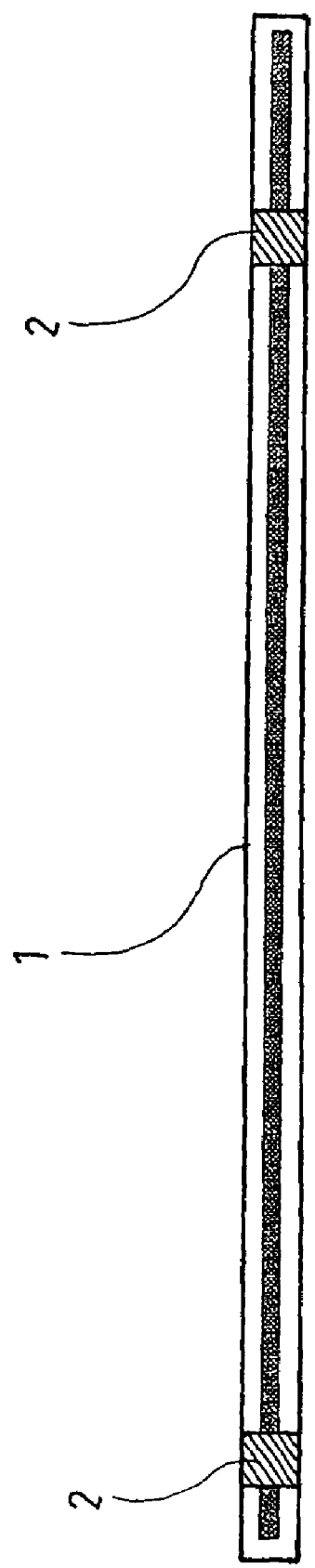
FIG. 2 is a schematic view showing that the substrate is stuffed with conductive material in the present invention.
Figure 3:
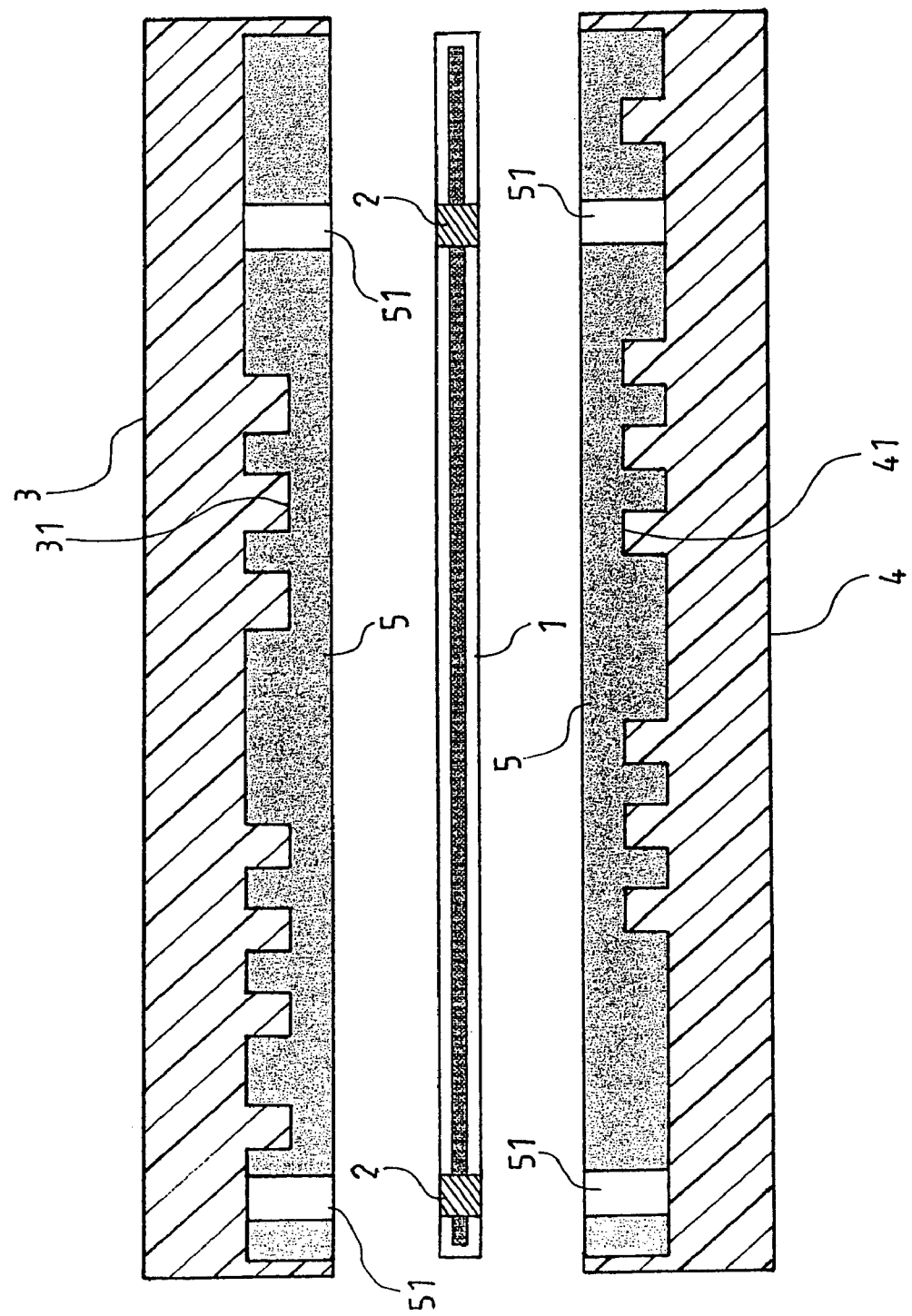
FIG. 3 is a schematic view showing a mold coated with epoxy in the present invention.
Figure 4:
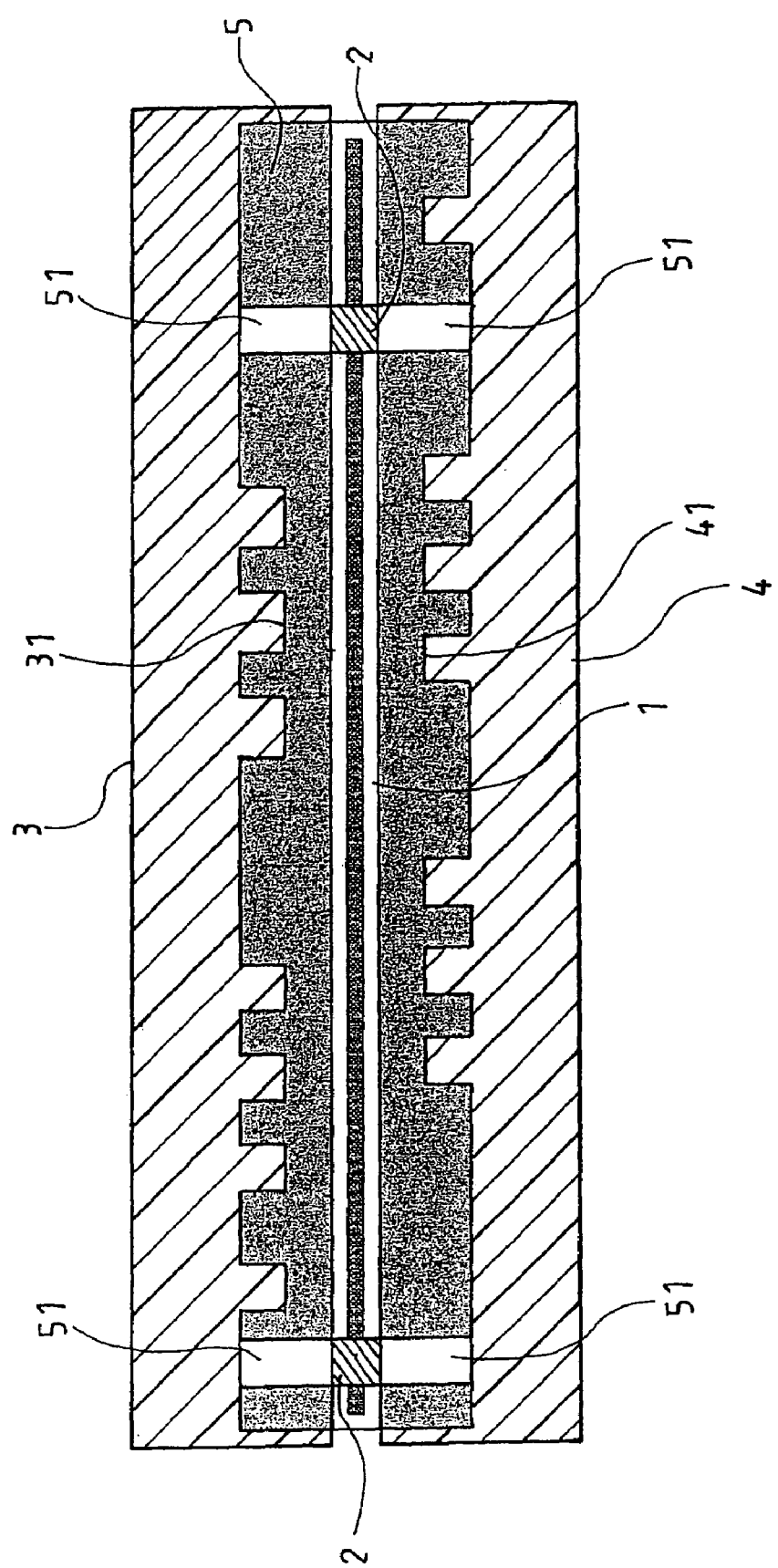
FIG. 4 is a schematic view showing that the mold and the substrate over laminated to each other in the present invention.
Figure 5:
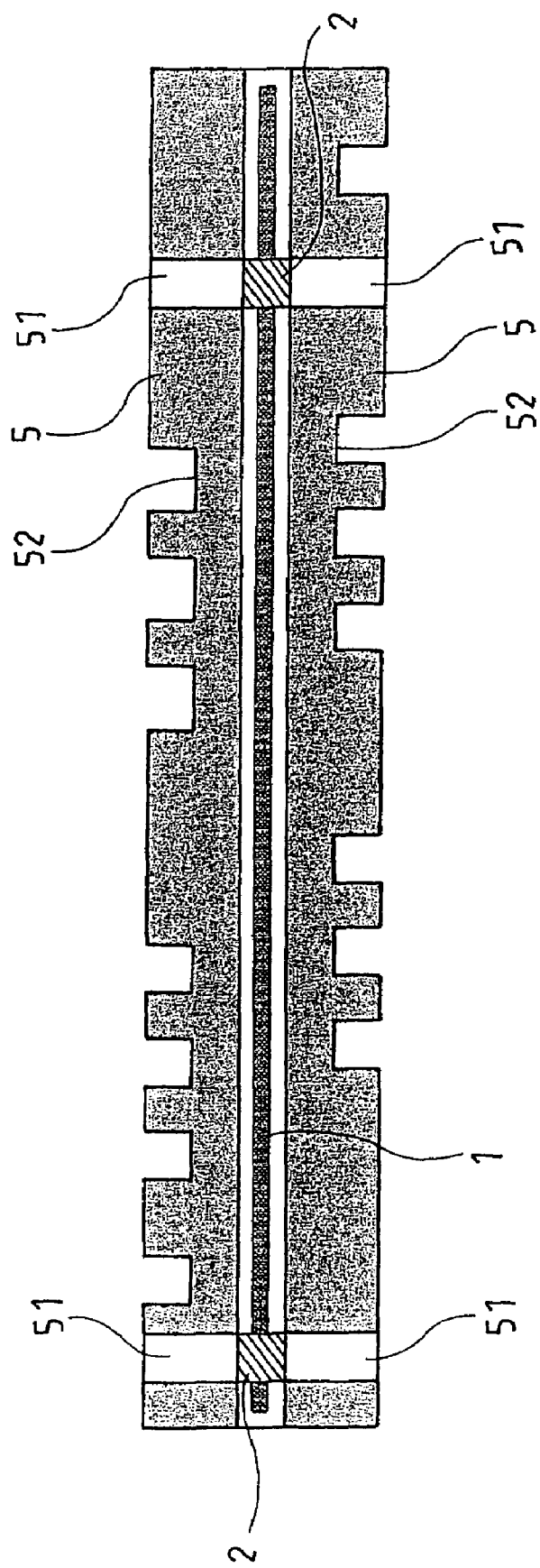
FIG. 5 is a schematic view showing that the epoxy after having stripped from the mold is adhered to the substrate in the present invention.
Figure 6:
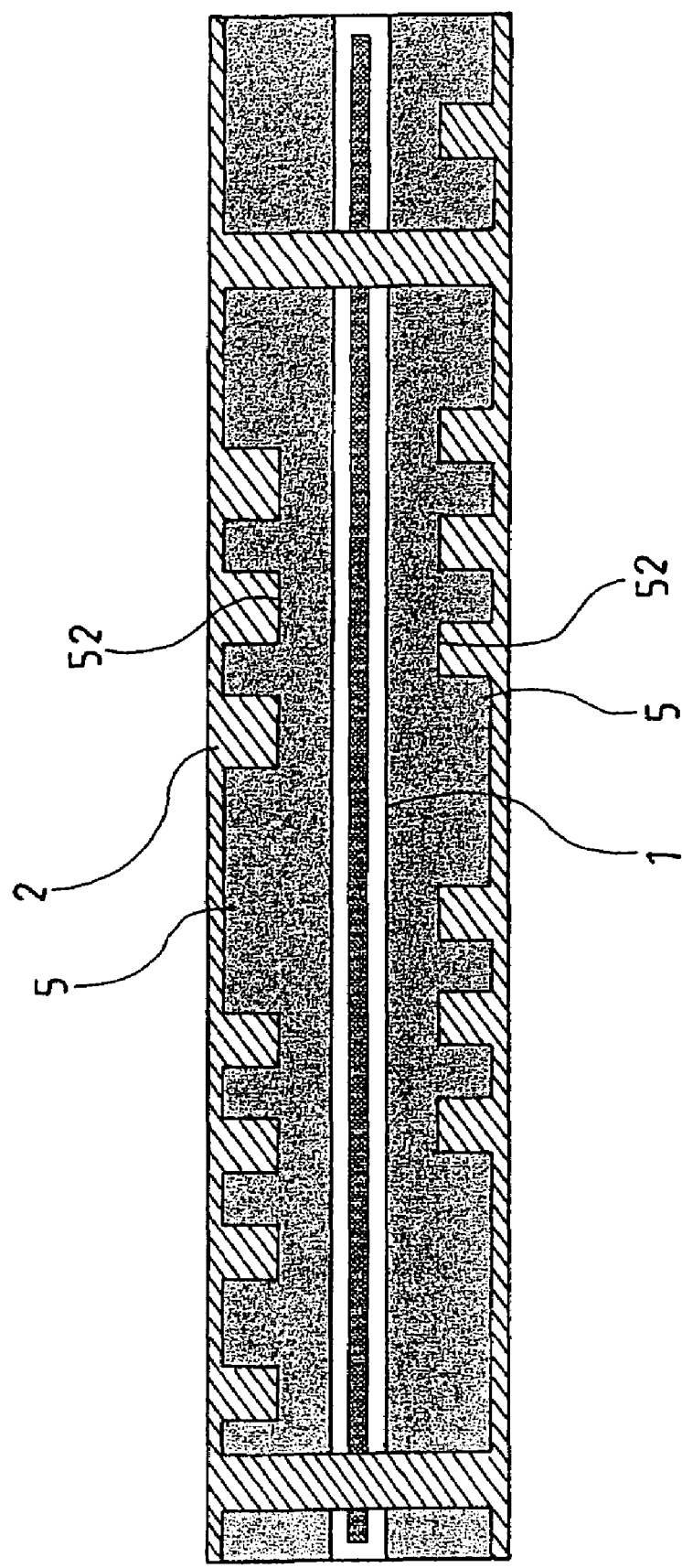
FIG. 6 is a schematic view showing the epoxy is coated with conductive material in the present invention.
Figure 7:
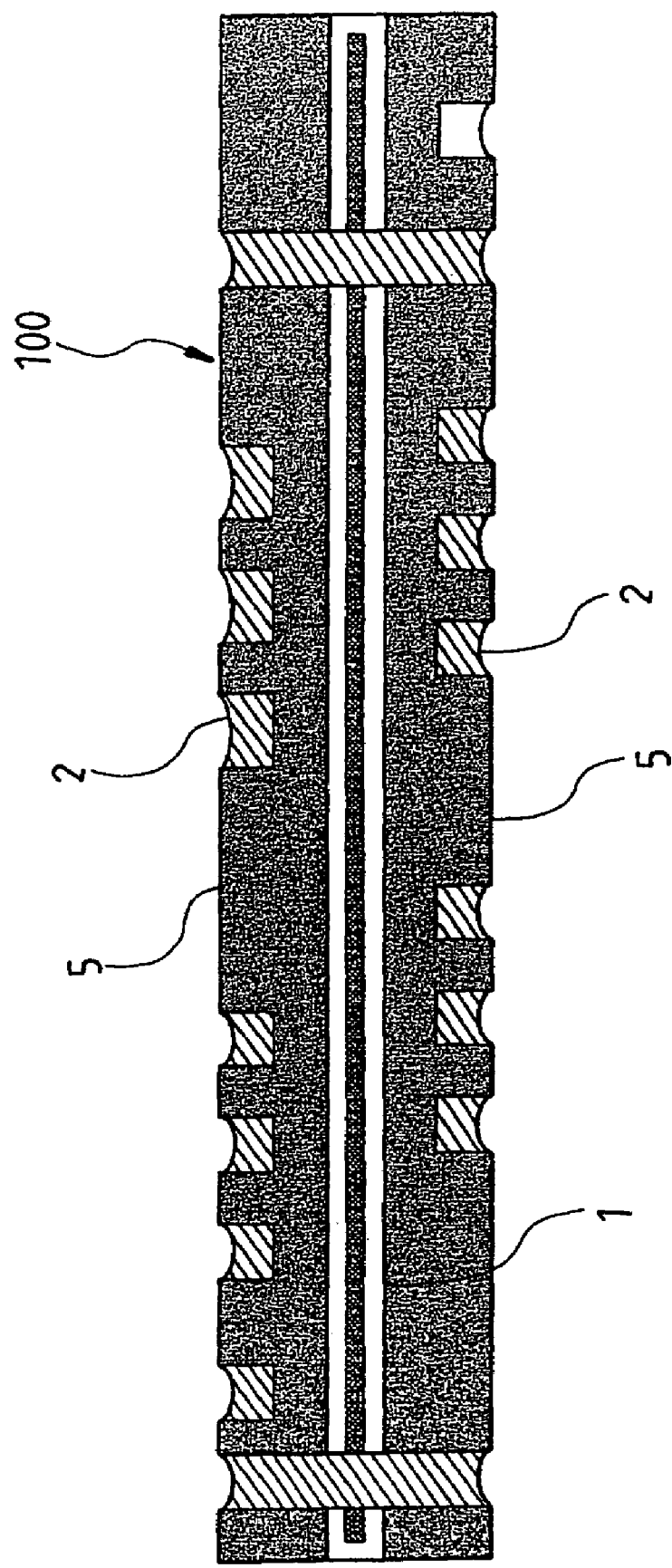
FIG. 7 is a schematic view showing a finished product of a circuit board of the present invention.

Referring to FIGS. 1 through 7, the multi-layer PCB manufacturing process of the present invention is essentially comprised of the following steps:

1. Multiple through holes 11 are drilled through the fiberglass substrate 1 as illustrated in FIG. 1.
2. Each through hole 11 on the substrate 1 is stuffed with a conductive material 2 as illustrated in FIG. 2.
3. An upper and a lower steel molds 3, 4 are provided and engraved with floated circuitries 31, 41 (the printed circuitry as found with the regular PCB); then both molds 3, 4 are coated with epoxy 5; the substrate 1 is sandwiched by both molds 3, 4 with the side respectively coated with epoxy 5; a through hole 51 is preset on the epoxy 5 as illustrated in FIG. 3.
4. The substrate 1 bound with both of the upper and the lower molds 3, 4 is baked and solidified as illustrated 4 before having both of the upper and the lower molds 3, 4 removed.
5. With both molds 3, 4 removed, the epoxy 5 is closely adhered to the substrate 1 while a recessed circuitry 52 is formed on the surface of the epoxy 5 as illustrated in FIG. 5, followed with sandblasting to remove the film and rinsing.
6. The surface of the epoxy 5 is then coated with the conductive material 2 to such extent that the conductive material 2 is consistently inserted into the circuitry 52 and the through hole 51 on the epoxy 5 as illustrated in FIG. 6 before being vacuum removed with air bulbs, baked and solidified.
7. Finally, the sandblasting process is applied to remove any excessive conductive material 2 leaving only the circuitry 52 and the through hole 51 on the epoxy 5 inserted with the conductive material 2 to come up with the finished product of a PCB 100 as illustrated in FIG. 7.

The PCB 100 is conducted through due to that the conductive material 2 is consistently inserted in the circuitry 52 on the epoxy 5 as it is found with a cooper foil printed circuit of the regular PCB.

Figure 8:
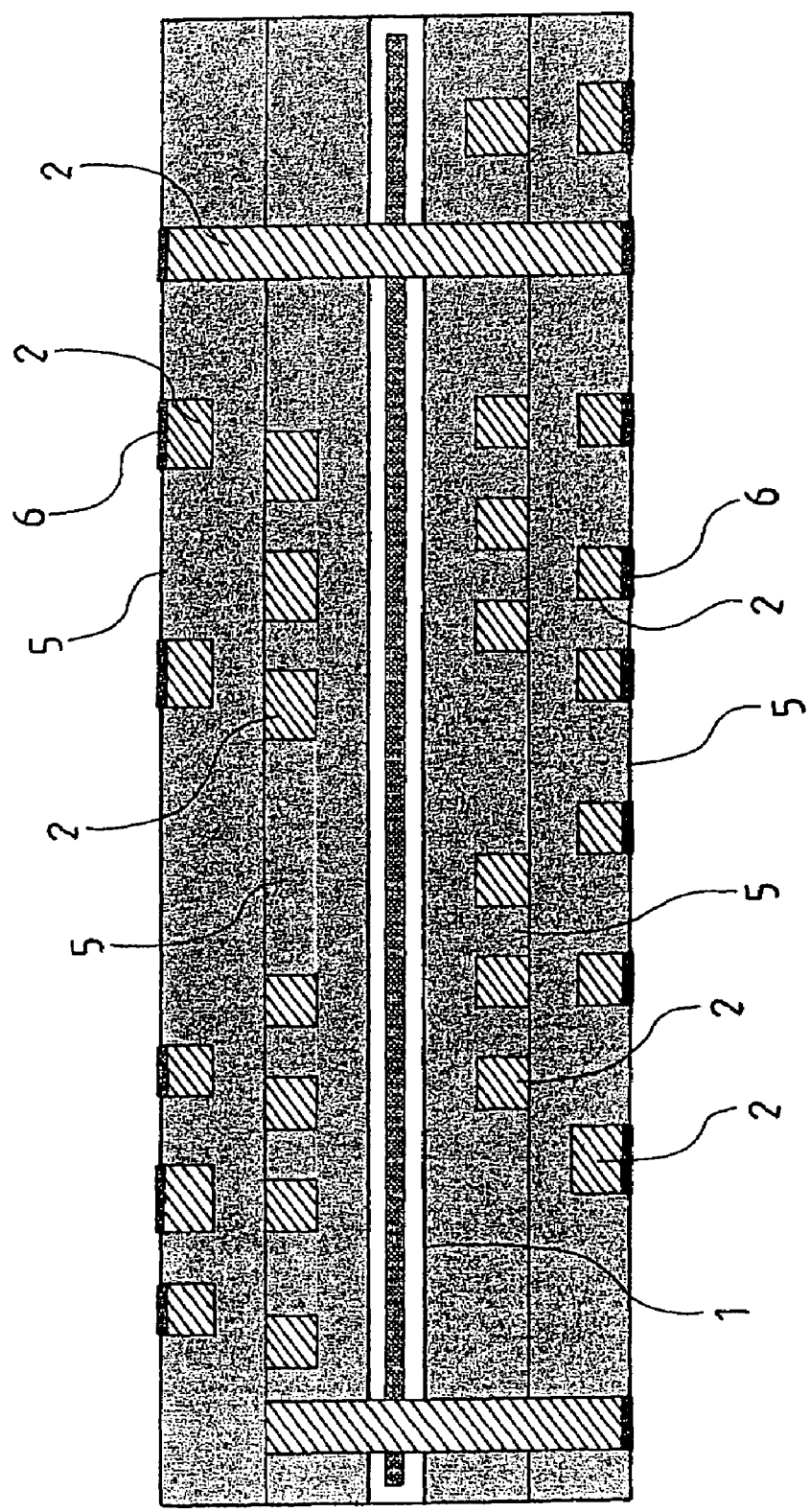
FIG. 8 is a schematic view of a multi-layer circuit board lamination and copper plating in the present invention.

As illustrated in FIG. 8, multiple layers processed by repeating those steps given above are then laminated to constitute a multi-layer PCB while the part of the circuitry pending soldering on the most outer layer is plated with copper 6 to increase the mechanical strength of the PCB. Finally, the part coated with copper 6 is sandblasted to remove the film, and rinsed in the final cleaning process.

Advantages provided by the present invention include:
1. Improved strip off strength and thermo-durability since the circuitry is formed by inserting the conductive material 2 into the epoxy 5.
2. Free of deformed PCB and variations of dimension due to stress from the high pressure since the pressurized lamination process is not required in the present invention.
3. Significant savings in materials consumption and facilities thus to facilitate the scheduling of continuous production since the image transfer process is not required in the present invention.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A pre-casting process for the manufacturing of a multi-layer printed circuit board (PCB) comprising the following steps:
   Step 1: drilling a plurality of through holes through a fiberglass substrate and stuffing each of the through holes with a conductive material;
   Step 2: providing steel molds having engraved with floated circuitries; coating both molds with epoxy; and a through hole is preset on the epoxy;
   Step 3: binding the substrate to the coated molds then baking and solidifying the epoxy then removing the molds to form a recessed circuitry on the surface of the epoxy;
   Step 4: sandblasting the exposed bound substrate to remove a film of epoxy and rinsing the bound substrate; then coating the surface of the epoxy with the conductive material to such extent that the conductive material is consistently inserted into the recessed circuit and the through hole on the epoxy;
   Step 5: removing any air bulbs in the recessed circuitry and through hole by vacuum then baking and solidifying the conductive material;
   Step 6: removing any excessive conductive material by sandblasting process to leave only the conductive material in the recessed circuitry and the through hole to form a PCB; and
   Step 7: repeating steps 2–6 to laminate layers of circuitries on the substrate to form the multi-layer PCB, wherein a part pending soldering of the circuitry on the most outer layer of the multi-layer PCB is plated with copper for increasing bonding mechanical strength.

* * * * *